United States Patent
Kim et al.

(10) Patent No.: US 8,018,021 B2
(45) Date of Patent: Sep. 13, 2011

(54) SCHOTTKY DIODE AND METHOD OF FABRICATING THE SAME

(75) Inventors: Dae-Shik Kim, Suwon-si (KR);
Oh-Kyum Kwon, Suwon-si (KR);
Myung-Hee Kim, Suwon-si (KR);
Yong-Chan Kim, Suwon-si (KR);
Hye-Young Park, Seoul (KR);
Joon-Suk Oh, Seocho-gu (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/662,452

(22) Filed: Apr. 19, 2010

(65) Prior Publication Data

US 2010/0200945 A1      Aug. 12, 2010

(51) Int. Cl.
*H01L 29/872*      (2006.01)
(52) U.S. Cl. . 257/476; 257/484; 257/485; 257/E29.013; 257/E29.148
(58) Field of Classification Search .................. 257/476, 257/484, 485, E29.013, E29.148, E21.046, 257/E21.047
See application file for complete search history.

(56) References Cited

U.S. PATENT DOCUMENTS

| 4,862,244 A | 8/1989 | Yamagishi |
| 4,874,714 A | 10/1989 | Eklund |
| 6,784,489 B1 | 8/2004 | Menegoli |

FOREIGN PATENT DOCUMENTS

| JP | 64-014967 | 1/1989 |
| JP | 03-034371 | 2/1991 |
| KR | 1020020004807 A | 1/2002 |
| KR | 10-2006-0073088 | 6/2006 |

OTHER PUBLICATIONS

U.S. Office Action dated Jul. 14, 2008 for parent U.S. Appl. No. 11/797,560.
U.S. Office Action dated Jan. 7, 2009 for parent U.S. Appl. No. 11/797,560.
U.S. Office Action dated Jul. 8, 2009 for parent U.S. Appl. No. 11/797,560.
U.S. Office Action dated Feb. 17, 2010 for parent U.S. Appl. No. 11/797,560.
Machine Translation of Korean Patent Publication 10-2006-0073088.

*Primary Examiner* — Ha Tran T Nguyen
*Assistant Examiner* — Suberr Chi
(74) *Attorney, Agent, or Firm* — Harness, Dickey & Pierce

(57) ABSTRACT

A schottky diode may include a schottky junction including a well formed in a semiconductor substrate and a first electrode contacting the first well. The well may have a first conductivity type. A first ohmic junction may include a first junction region formed in the well and a second electrode contacting the first junction region. The first junction region may have a higher concentration of the first conductivity type than the well. A first device isolation region may be formed in the semiconductor substrate separating the schottky junction and the first ohmic junction. A well guard having a second conductivity type opposite to the first conductivity type may be formed in the well. At least a portion of the well guard may be formed under a portion of the schottky junction.

1 Claim, 19 Drawing Sheets

SCHOTTKY DIODE AND METHOD OF FABRICATING THE SAME

PRIORITY STATEMENT

This application claims the benefit under 35 U.S.C. §§120, 121 of U.S. patent application Ser. No. 11/797,560 filed on May 4, 2007. The entire contents of U.S. patent application Ser. No. 11/797,560 entitled "SCHOTTKY DIODE AND METHOD FOR FABRICATING THE SAME," are incorporated herein by reference.

This U.S. non-provisional application claims the benefit of priority from Korean Patent Application No. 10-2006-0062838, filed on Jul. 5, 2006, in the Korean Intellectual Property Office (KIPO), the disclosure of which is incorporated herein in its entirety by reference.

BACKGROUND

1. Field

Example embodiments relate to a semiconductor device and a method for fabricating the same, for example, a schottky diode and a method for fabricating the same.

2. Description of the Related Art

A schottky diode is a semiconductor device including a schottky junction between a semiconductor and a metal. Because the schottky barrier may predominantly emit majority carriers and may have little or no recombination or storage of minority carriers to limit switching speed, the schottky diode may exhibit a faster switching characteristic. Because the semiconductor device is driven in a tunneling method using the schottky junction between a semiconductor and a metal, a voltage drop characteristic in an ON state may be obtained that is lower than may be obtained in a P-N diode.

Thus, schottky diodes may be widely used as a core device in the applied fields of communications and portable apparatuses, which may require a lower loss characteristic. However, Schottky diodes may be external type schottky diodes which may require additional fabrication. Thus, additional costs and time may be needed for the fabrication.

SUMMARY

Example embodiments may provide a schottky diode which may be formed on the same semiconductor substrate where an NMOS, PMOS, or CMOS transistor is located, without deterioration of the characteristics thereof.

Example embodiments may provide a method for fabricating a schottky diode which may be formed on the same semiconductor substrate where an NMOS, PMOS, or CMOS transistor is located, without deterioration of the characteristics thereof.

In an example embodiment, a schottky diode may include a schottky junction including a well formed in a semiconductor substrate and a first electrode contacting the first conductive well. The well may have a first conductivity type. A first ohmic junction may include a first junction region formed in the well and a second electrode contacting the first junction region. The first junction region may have a higher concentration of the first conductivity type than the well. A first device isolation region may be formed in the semiconductor substrate separating the schottky junction and the first ohmic junction. A well guard having a second conductivity type opposite to the first conductivity type may be formed in the well. At least a portion of the well guard may be formed under a portion of the schottky junction.

According to an example embodiment, the first device isolation region and the first electrode may be spaced apart from each other.

According to an example embodiment, at least a portion of the well guard may be formed under an outer perimeter portion of the schottky junction.

According to an example embodiment, the well guard may be formed in the shape of a ring having one of a square shape, a rectangular shape, a circular shape, and an elliptical shape.

According to an example embodiment, each of the first and second electrodes may include a silicide.

According to an example embodiment, the first and second electrodes may include a same silicide or different silicides.

According to an example embodiment, the first and second electrodes may include cobalt silicide.

According to an example embodiment, the first electrode may include titanium silicide and the second electrode may include cobalt silicide.

According to an example embodiment, a second ohmic junction may be formed to induce a leakage current to flow from the first well to the semiconductor substrate. A second device isolation region may separate the first ohmic junction and the second ohmic junction.

According to an example embodiment, the second ohmic junction may include a second junction region formed in the well and a third electrode contacting the second junction region. The second junction region may have a higher concentration of the second conductivity type than a concentration of the second conductivity type in the well guard.

In an example embodiment, a method for fabricating a schottky diode may include forming a well having a first conductivity type in a semiconductor substrate; forming a first device isolation region in the well to separate a schottky junction region from a first ohmic junction region; forming a well guard having a second conductivity type opposite to the first conductivity type in the well, at least a portion of the well guard formed in a portion of the schottky junction region; forming a first junction region in the first ohmic junction region, the first junction region having a higher concentration of the first conductivity type than the well; and forming an electrode over the first ohmic junction region contacting the first junction region.

According to an example embodiment, the method may further include forming an electrode over the schottky junction region simultaneously with forming the electrode over the ohmic junction region.

According to an example embodiment, each of the electrode of the ohmic junction and the electrode of the schottky junction may include a silicide.

According to an example embodiment, the electrode of the ohmic junction and the electrode of the schottky junction may include cobalt silicide.

According to an example embodiment, the method may further include forming an interlayer insulation film on the semiconductor substrate; forming a contact hole in the interlayer insulation film exposing at least a portion of the schottky junction region; forming an electrode in the schottky junction region by forming a barrier metal film covering the interlayer insulation film and the schottky junction region; and applying a heat treatment to the barrier metal film to form a silicide in the schottky junction region.

According to an example embodiment, each of the electrode of the ohmic junction and the electrode of the schottky junction may include a silicide.

According to an example embodiment, the electrode of the ohmic junction may include cobalt silicide and the electrode of the schottky junction may include titanium silicide.

According to an example embodiment, the method may further include forming a second ohmic junction in the semiconductor substrate; and forming a second device isolation region separating the first ohmic junction and the second ohmic junction. The second ohmic junction may induce a leakage current to flow from the well to the semiconductor substrate.

According to an example embodiment, forming the second ohmic junction may include forming a second junction region in the semiconductor substrate and forming a third electrode contacting the second junction region. The second junction region may have a higher concentration of the second conductivity type than the well guard.

According to an example embodiment, the internal schottky diode may be fabricated simultaneously with an NMOS transistor, a PMOS transistor, or a CMOS transistor which is formed on the same semiconductor substrate where the internal schottky diode is formed.

BRIEF DESCRIPTION OF THE DRAWINGS

Example embodiments will be described with reference to the accompanying drawings.

DESCRIPTION OF EXAMPLE EMBODIMENTS

Figure 1:
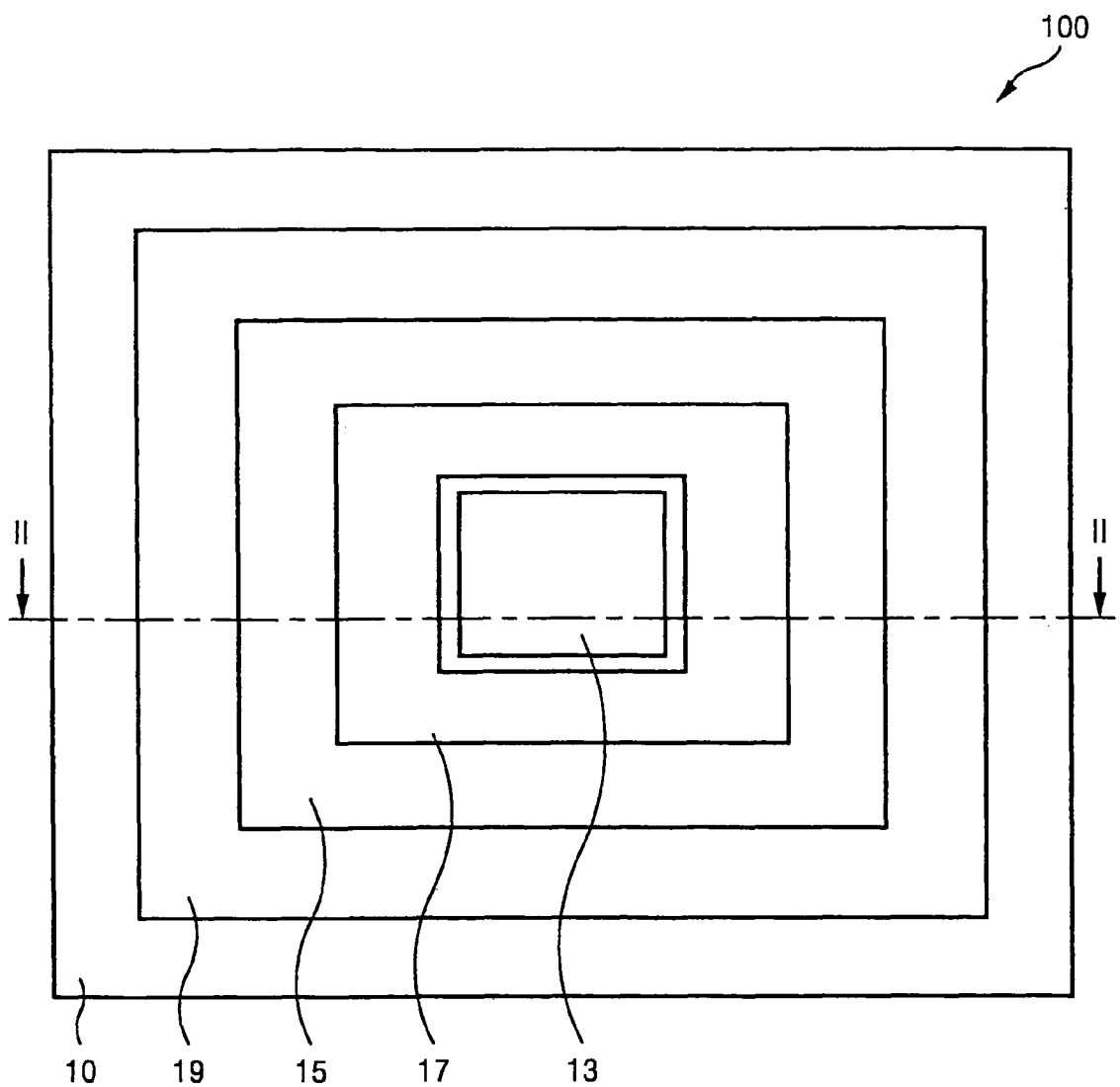
FIG. 1 is a plan view of a schottky diode according to an example embodiment.

Example embodiments will now be described more fully with reference to the accompanying drawings. However, example embodiments may be embodied in many different forms and should not be construed as being limited to the example embodiments set forth herein. Example embodiments are provided so that this disclosure will be thorough, and will fully convey the scope to those who are skilled in the art. In some example embodiments, well-known processes, well-known device structure, and well-known technologies are not described in detail to avoid the unclear interpretation of the example embodiments. Throughout the specification, like reference numerals in the drawings denote like elements.

It will be understood that when an element or layer is referred to as being "on", "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-section illustrations that may be schematic illustrations of idealized embodiments (and intermediate structures). As such, variations from the shapes of the illustrations as a result, for example, of manufacturing techniques and/or tolerances, are to be expected. Thus, the example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to limit the example embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Furthermore, the words of the "first conductive type" and the "second conductive type" indicate conductive types opposite to each other, for example, P-type or N-type.

Figure 2:
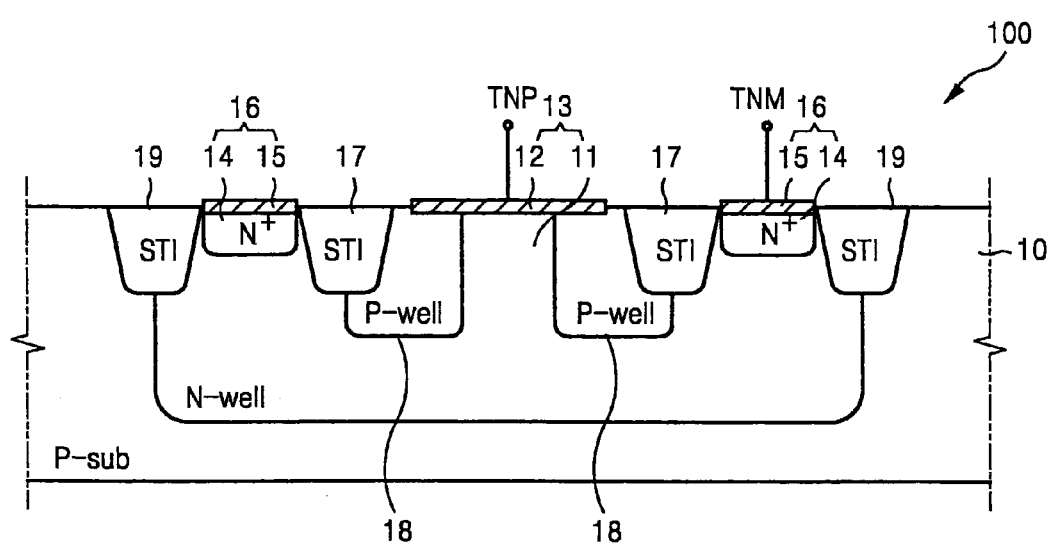
FIG. 2 is a cross-sectional view taken along line II-II' of FIG. 1.

FIG. 1 is a plan view of a schottky diode according to an example embodiment. FIG. 2 is a cross-sectional view taken along line II-II' of FIG. 1.

A schottky diode 100 may include a schottky junction 13 including a first conductive well 11 formed in a semiconductor substrate 10 and a first electrode 12 contacting the first conductive well 11, Further included is an ohmic junction 16 including a first conductive higher concentration junction region 14 located in the first conductive well 11 and a second electrode 15 contacting the first conductive higher concentration junction region 14. A first device isolation region 17 may be formed in the first conductive well 11 separating the schottky junction 13 and the ohmic junction 16. A second conductive type well guard 18 may be formed in the first conductive well 11 having at least a portion thereof formed under the outer perimeter of the schottky junction 13. A second device isolation region 19 may be formed in the semiconductor substrate 10 and/or the first conductive well 11, outside of the outer perimeter of the ohmic junction 16. "TNP" and "TNM" respectively denote ports that may be connected to the schottky junction 13 and the ohmic junction 16. The electric potential of the TNP may correspond to the electric potential at a metal side of the schottky junction 13, while the electric potential of the TNM may correspond to a semiconductor side of the schottky junction 13.

In example embodiments disclosed in the present specification, the first conductive type may be an N-type and the second conductive type may be a P-type. However, example embodiments are not limited thereto.

Figure 3:
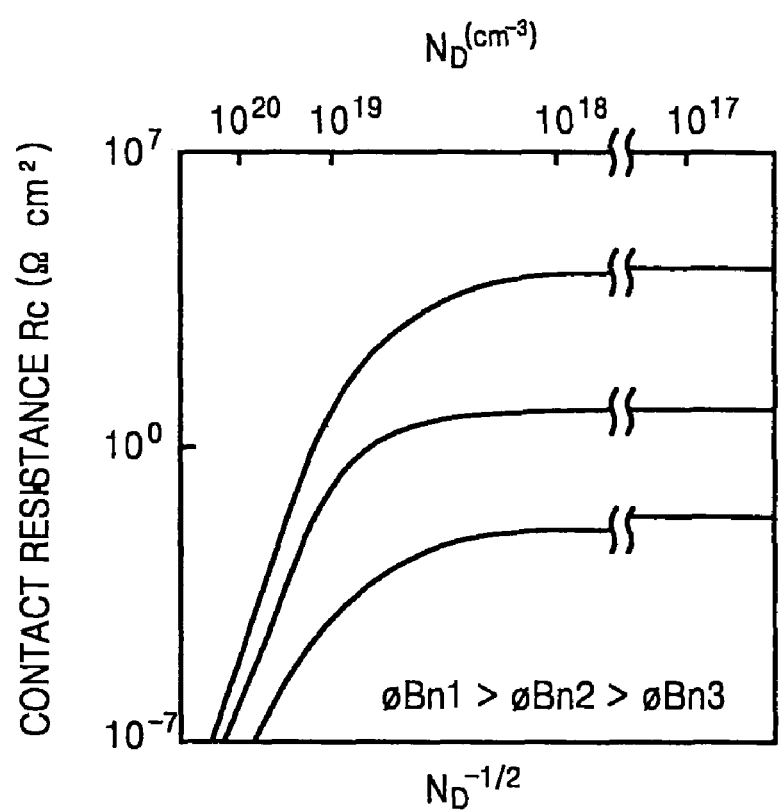
FIG. 3 is a graph showing the relationship between the concentration of impurities and the contact resistance of a semiconductor.

FIG. 3 is a graph showing the relationship between the concentration of impurities and the contact resistance of a semiconductor. Referring to FIG. 3, for example, a semiconductor-metal junction having a doner impurity concentration of $10^{17}$ cm$^{-3}$ may become a schottky junction while a semiconductor-metal junction having a higher doner impurity concentration of $10^{19}$ cm$^{-3}$ or more may become an ohmic junction. Thus, the schottky junction 13 may be formed in a portion where the N-type well 11 having a lower impurity concentration and the first electrode 12 contact each other. The ohmic junction may be formed in a portion where the N-type higher concentration junction region 14 having a higher impurity concentration and the second electrode 15 contact each other.

Although it is not shown, if a P-type semiconductor where acceptor impurity is added and a metal contact each other, a boundary surface between a P-type well region having a lower impurity concentration and a metal electrode may form a schottky junction while a boundary surface between a P-type higher concentration junction region having a higher impurity concentration and a metal electrode may form an ohmic junction.

The first and second electrodes 12 and 15 of the schottky junction 13 and the ohmic junction 16 may include a silicide. The first electrode 12 of the schottky junction 13 and the second electrode 15 of the ohmic junction 16 may include the same silicide. For example, each of the first and second metal electrodes 12 and 15 may include one of titanium (Ti) silicide, tungsten (W) silicide, molybdenum (Mo) silicide, tantalum (Ta) silicide, cobalt (Co) silicide, nickel (Ni) silicide, or etc.

The schottky junction 13 and the ohmic junction 16 may be electrically separated by the first device isolation region 17 formed in the semiconductor substrate 10. The first device isolation region 17 may be, for example, a shallow trench isolation (STI). The first electrode 12 of the schottky junction 13 and the first device isolation region 17 may be spaced apart from each other, the reason for which will be discussed below in describing a method for fabricating a schottky diode according to an example embodiment.

The well guard 18 may be provided to reduce the concentration of an electric field and improve a breakdown voltage (BV) characteristic during a reverse bias so that the electric potential of the TNM may be set higher than the TNP. The well guard 18 may be provided so that at least a portion thereof is formed under the outer perimeter of the schottky junction 13. The well guard may be formed the shape of a ring, for example, in a square shaped ring, a rectangular shaped ring, a circular shaped ring, an elliptical shaped ring, or etc. The well guard 18 may be of a well type, and a variety of well-type guards 18 may be applied according to the BV characteristic needed for the schottky diode 100. For example, the well guard 18 may be a pocket P-type well (PPwell) type that may be used as a source/drain of a higher voltage (HV) PMOS transistor or a P-type field interdiffused multilayer process (IMP) well type that may be used as a well of a lower voltage (LV) NMOS transistor.

The schottky diode 100 may be located on the same semiconductor substrate 10 where an NMOS transistor, a PMOS transistor, or a CMOS transistor may be located.

Figure 4:
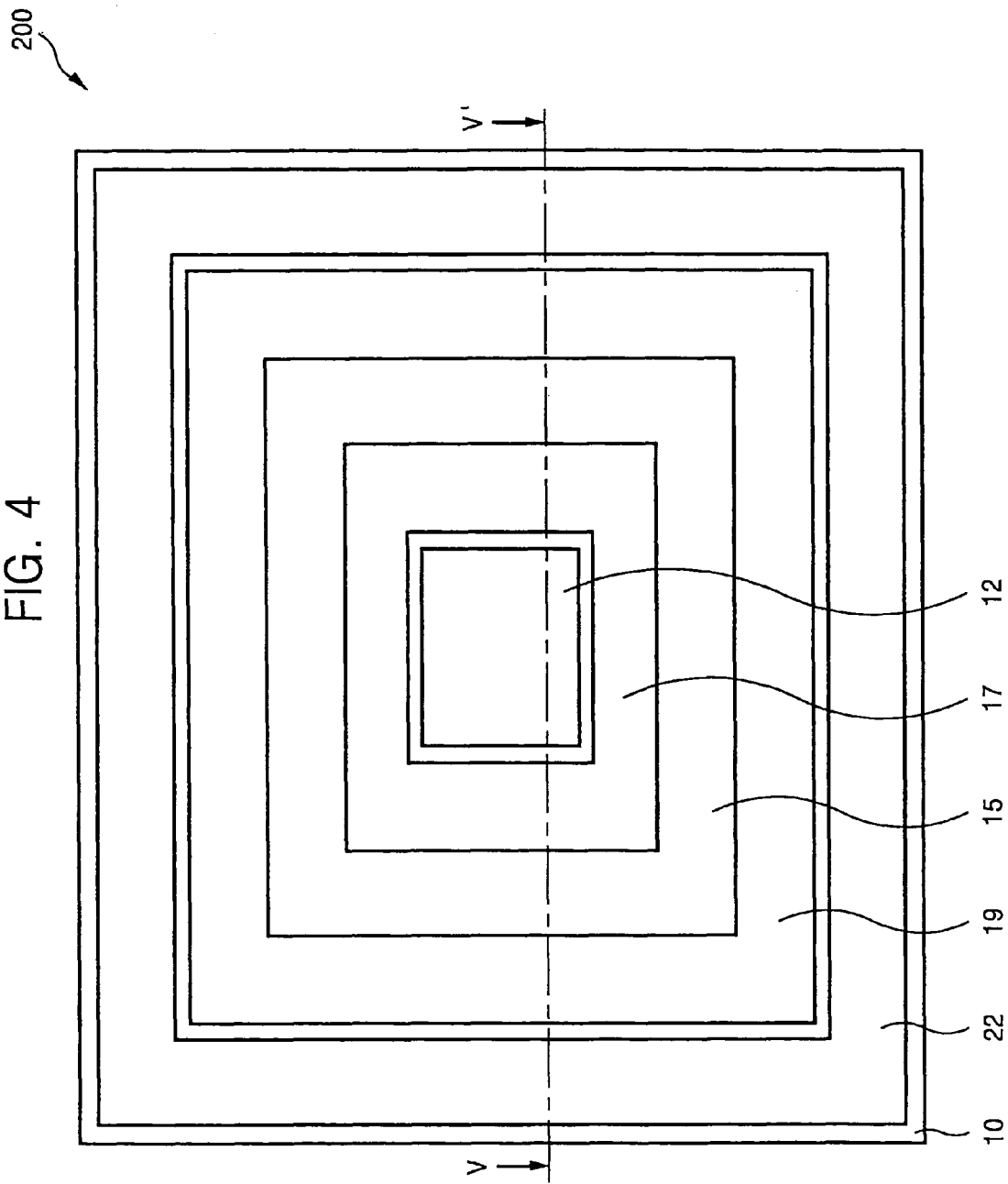
FIG. 4 is a plan view of a schottky diode according to another example embodiment.
Figure 5:
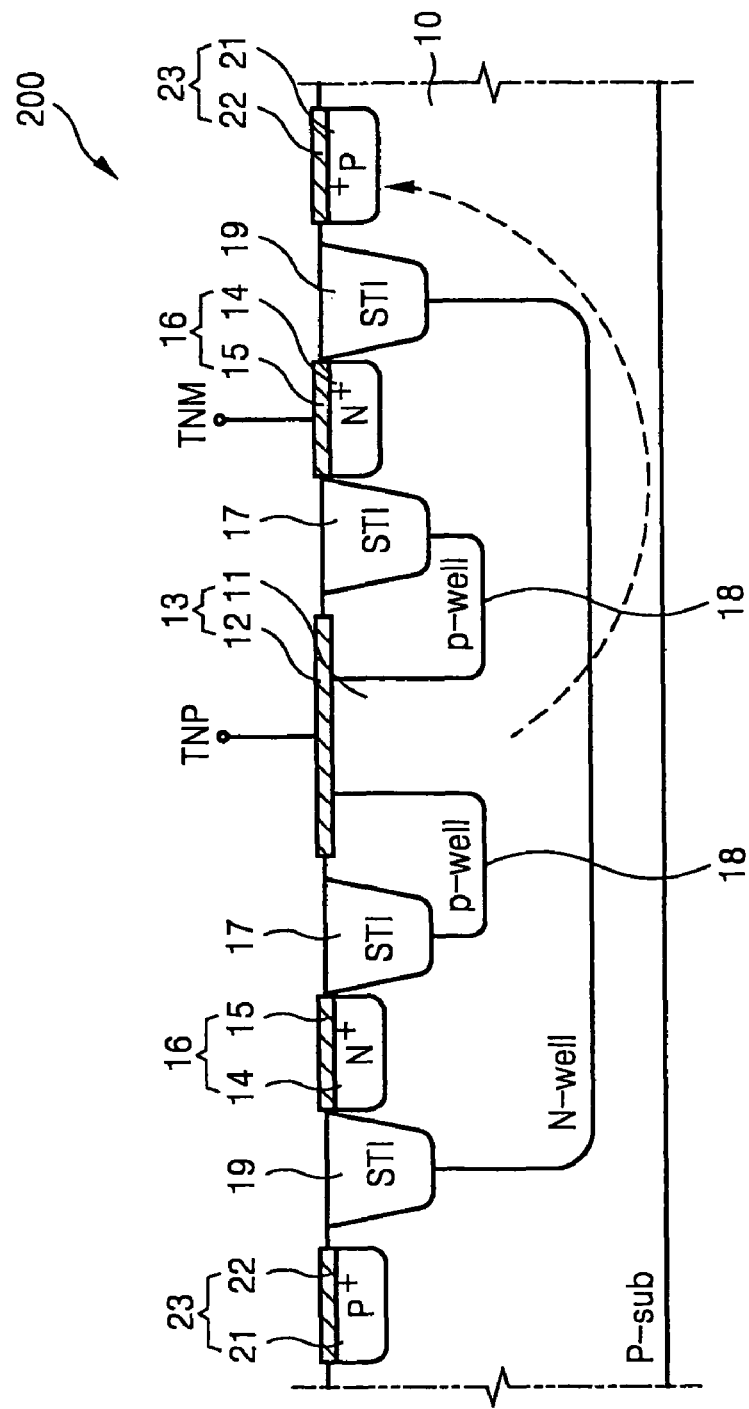
FIG. 5 is a cross-sectional view taken along line V-V' of FIG. 4.

FIG. 4 is a plan view of a schottky diode according to another example embodiment. FIG. 5 is a cross-sectional view taken along line V-V' of FIG. 4.

Referring to FIGS. 4 and 5, a schottky diode 200 according to an example embodiment may be substantially the same as the schottky diode 100 shown in the example embodiment of FIG. 1, except that the schottky diode 200 may include a second ohmic junction 23, which may induce a leakage current flowing from the well 11 toward the semiconductor substrate 10. Thus, the schottky diode 200 will be described regarding the difference from the schottky diode 100 shown in FIG. 1.

The second ohmic junction 23 may include a P-type higher concentration junction region 21 located in the semiconductor substrate 10 and a third electrode 22 contacting the P-type higher concentration junction region 21. The third electrode 22 may include a silicide. For example, the third electrode 22 may include one of titanium (Ti) silicide, tungsten (W) silicide, molybdenum (Mo) silicide, tantalum (Ta) silicide, cobalt (Co) silicide, nickel (Ni) silicide, or etc.

The second ohmic junction 23 may induce current to leak from the well 11 toward the semiconductor substrate 10, as indicated by a dotted line, during forward bias to set the electric potential of the TNP higher than that of the TNM. The induced leakage may prevent a defect in the schottky diode, which may occur if the leakage current flows arbitrarily. The second ohmic junction 23 may be electrically separated from the first ohmic junction 16 located in the well 11 by the second device isolation region 19.

Figure 6:
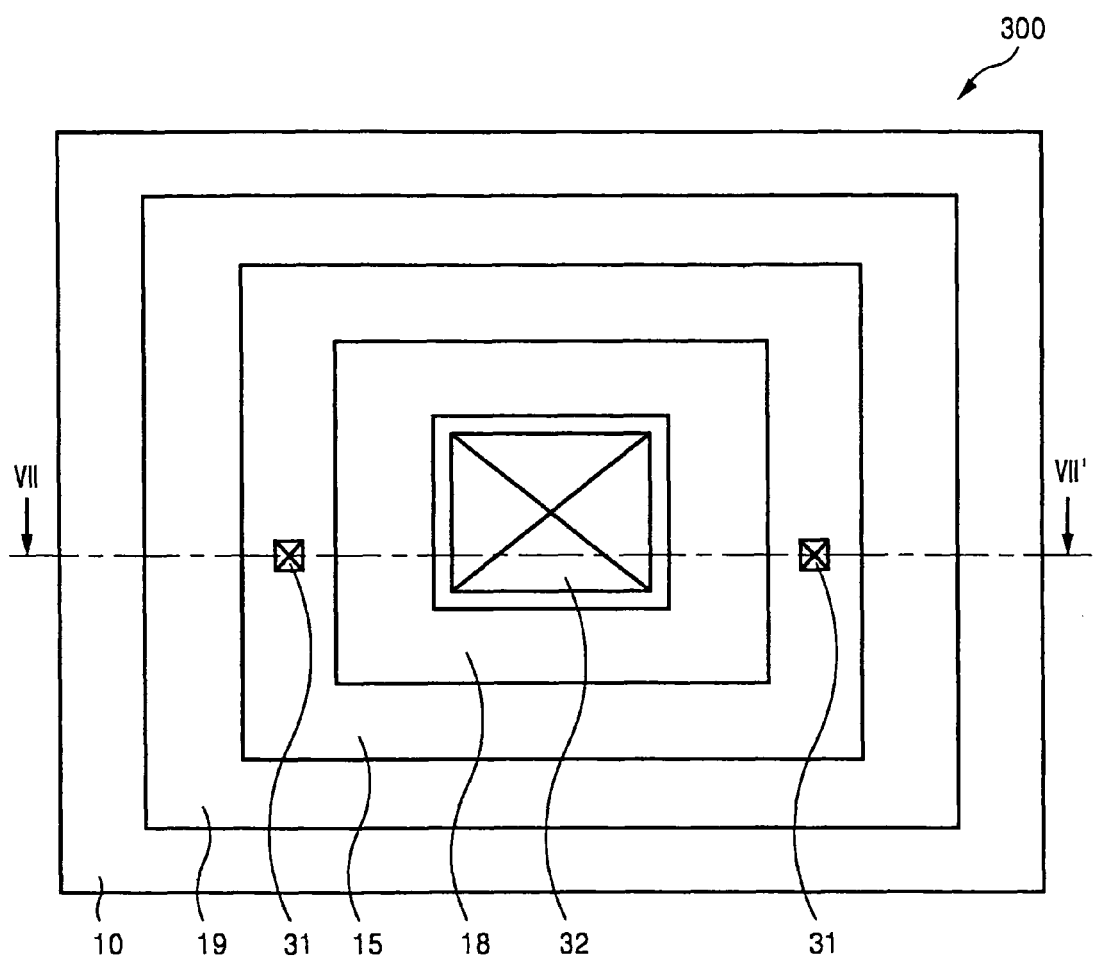
FIG. 6 is a plan view of a schottky diode according to yet another example embodiment.
Figure 7:
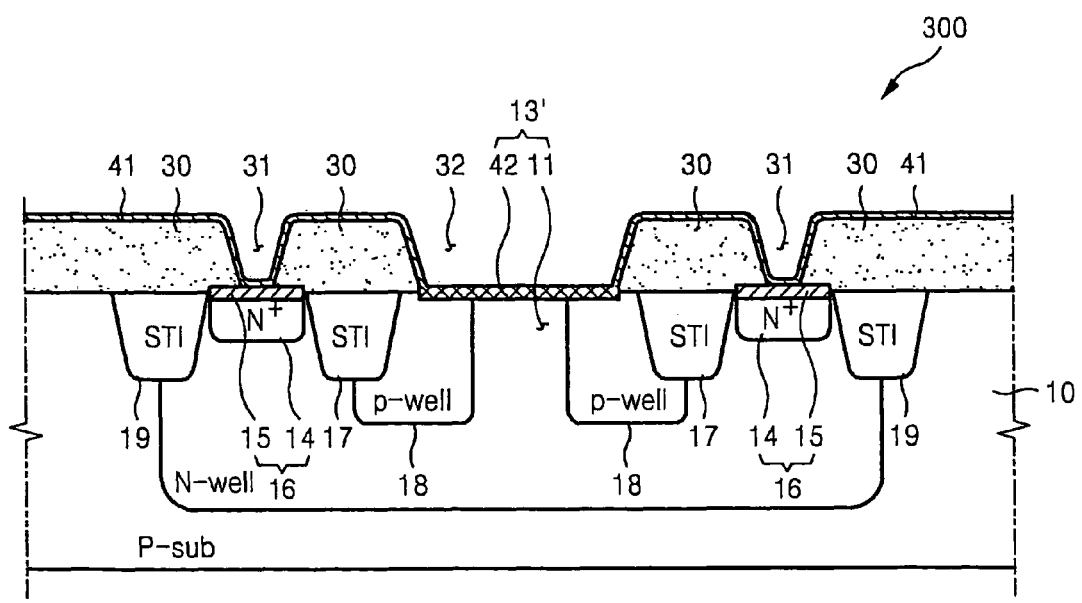
FIG. 7 is a cross-sectional view taken along line VII-VII' of FIG. 6.

FIG. 6 is a plan view of a schottky diode according to yet another example embodiment. FIG. 7 is a cross-sectional view taken along line VII-VII' of FIG. 6.

Referring to FIGS. 6 and 7, a schottky diode 300 according to yet another example embodiment may be substantially the same as the schottky diode 100 shown in the example embodiment of FIG. 1, except that the first electrode 42 of the schottky junction 13' and the second electrode 15 of the ohmic junction 16 may include silicides that may be different from each other. Thus, the schottky diode 300 will be described mainly regarding the difference from the schottky diode 100 shown in FIG. 1.

In the schottky diode 300, the first and second electrodes 42 and 15 included in the schottky junction 13' and the ohmic junction 16, respectively, may include silicides which are different from each other. For example, each of the first and second electrodes 42 and 15 may be a different one of titanium (Ti) silicide, tungsten (W) silicide, molybdenum (Mo) silicide, tantalum (Ta) silicide, cobalt (Co) silicide, or nickel (Ni) silicide, or etc. For example, the first electrode 42 of the schottky junction 13' may be titanium (Ti) silicide while the second electrode 15 of the ohmic junction 16 may be cobalt (Co) silicide.

The schottky diode 300 may include an interlayer insulation film 30 formed on the surface of the substrate 10. A first contact hole 31 may be formed in the interlayer insulation film to expose at least a portion of the first electrode 42 of the schottky junction 13'. A second contact hole 32 may be formed in the interlayer insulation film 30 to expose at least a portion of the second electrode 15 of the ohmic junction 16. A barrier metal film 41 may be formed on the interlayer insulation film 30 and the exposed portions of the first and second electrodes 42 and 15. The barrier metal film 41 may prevent inter-diffusion of heterogeneous materials between a metal wiring (not shown) and the semiconductor substrate 10, and may be formed of, for example, titanium (Ti), tungsten (W), molybdenum (Mo), tantalum (Ta), cobalt (Co), nickel (Ni), or etc.

Figure 8:
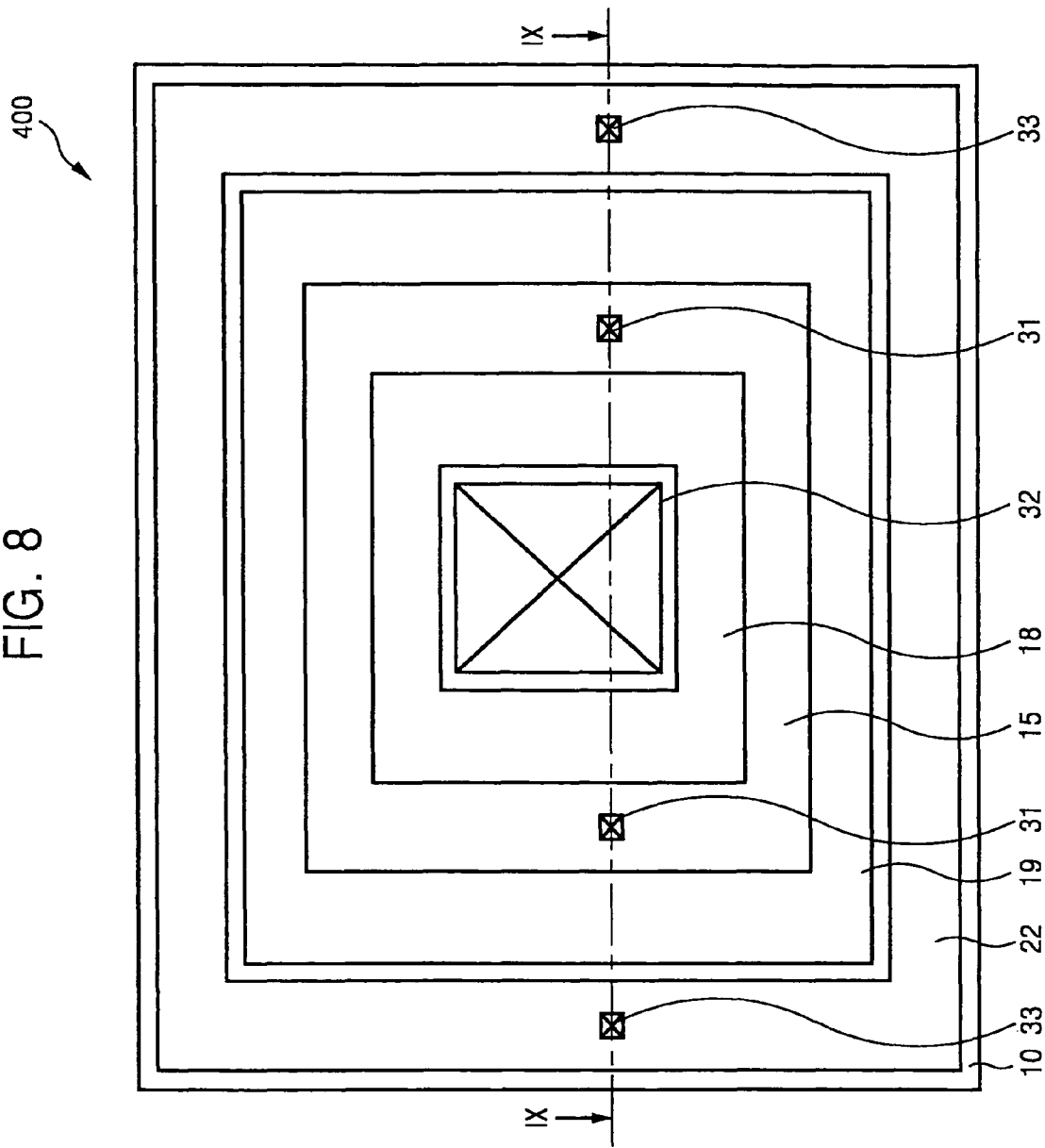
FIG. 8 is a plan view of a schottky diode according to yet further another example embodiment.
Figure 9:
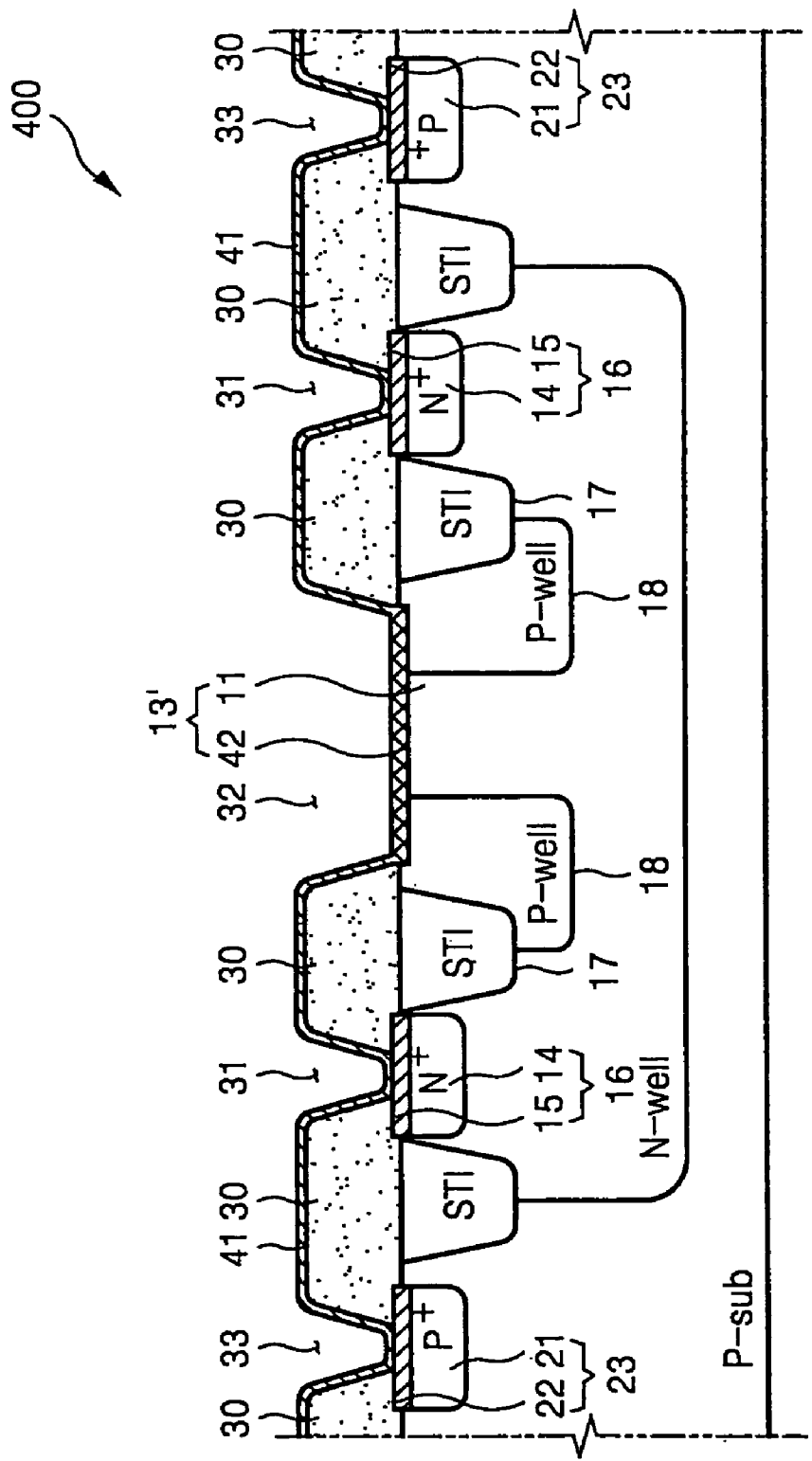
FIG. 9 is a cross-sectional view taken along line IX-IX' of FIG. 8.

FIG. 8 is a plan view of a schottky diode according to yet further another example embodiment. FIG. 9 is a cross-sectional view taken along line IX-IX' of FIG. 8.

Referring to FIGS. 8 and 9, a schottky diode 400 according to yet further another example embodiment may be substantially the same as the schottky diode 200 shown in the example embodiment of FIG. 4, except that the first electrode 42 of the schottky junction 13' and the second electrode 15 of the ohmic junction 16 may include silicides that may be different from each other. Thus, the schottky diode 400 will be described mainly regarding the difference from the schottky diode 200 as shown in FIG. 4.

In the schottky diode 400, the first and second electrodes 42 and 15 in the schottky junction 13' and the ohmic junction 16, respectively, may include silicides, which may be different from each other. For example, each of the first and second electrodes 42 and 15 may be a different one of titanium (Ti) silicide, tungsten (W) silicide, molybdenum (Mo) silicide, tantalum (Ta) silicide, cobalt (Co) silicide, nickel (Ni) silicide, or etc. For example, the first electrode 42 of the schottky junction 13' may be titanium (Ti) silicide while the second electrode 15 of the ohmic junction 16 may be cobalt (Co) silicide.

The third electrode 22 of the second ohmic junction 23 may be formed of a silicide different from that of the first electrode 42 of the schottky junction 13' or the same silicide as that of the first electrode 42. For example, if the first electrode 42 of the schottky junction 13' is titanium silicide, the third electrode 22 of the ohmic junction 13 may be cobalt silicide or titanium silicide.

The schottky diode 400 may include an interlayer insulation film 30 formed on the surface of the substrate 10. A first contact hole 31 may be formed in the interlayer insulation film that may expose at least a portion of the first electrode 42 of the schottky junction 13'. A second contact hole 32 may be formed in the interlayer insulation film 30 that may expose at least a portion of the second electrode 15 of the first ohmic junction 16. A third contact hole 33 may be formed in the interlayer insulation film 30 that may expose at least a portion of the third electrode 21 of the second ohmic junction 23. A barrier metal film 41 may be formed on the interlayer insulation film 30 and the exposed portions of the first, second, and third electrodes 42, 15, and 21. The barrier metal film 41 may prevent inter-diffusion of heterogeneous materials between a metal wiring (not shown) and the semiconductor substrate 10, and may be formed of, for example, titanium (Ti), tungsten (W), molybdenum (Mo), tantalum (Ta), cobalt (Co), nickel (Ni), or etc.

Figure 10:
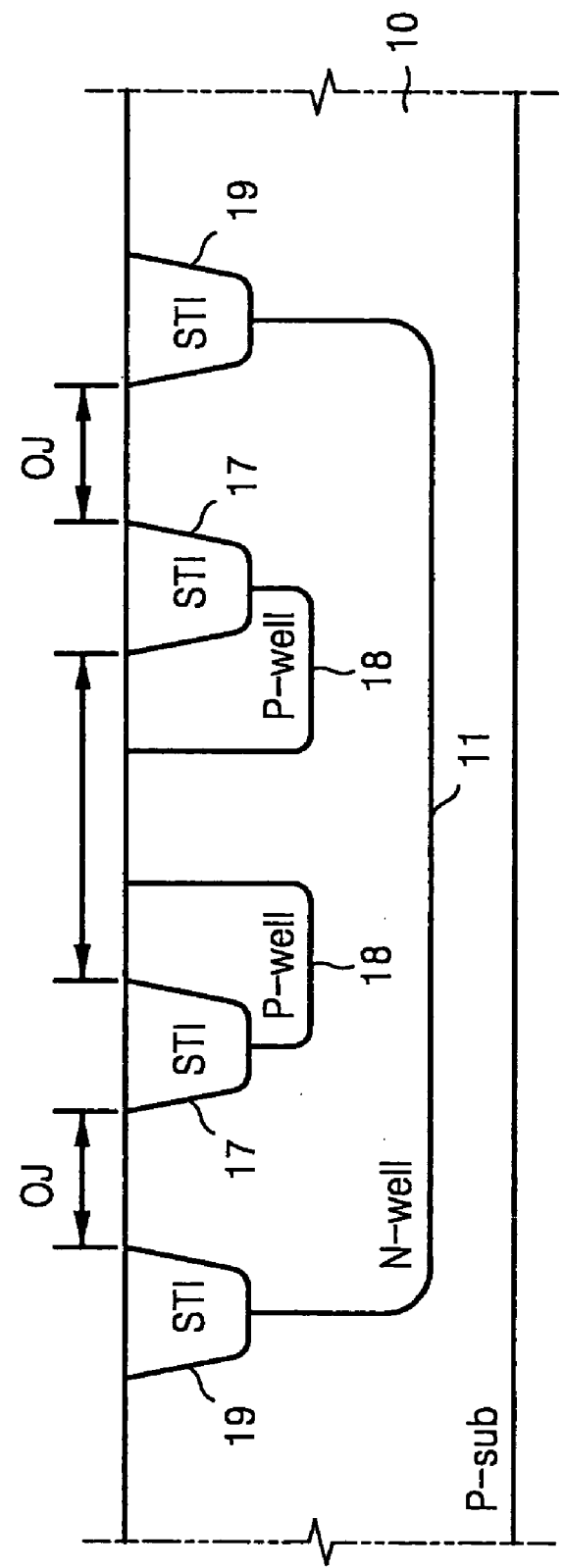
FIGS. 10 and 11 are cross-sectional views of the intermediate structures formed during a method for fabricating a schottky diode according to an example embodiment.
Figure 11:
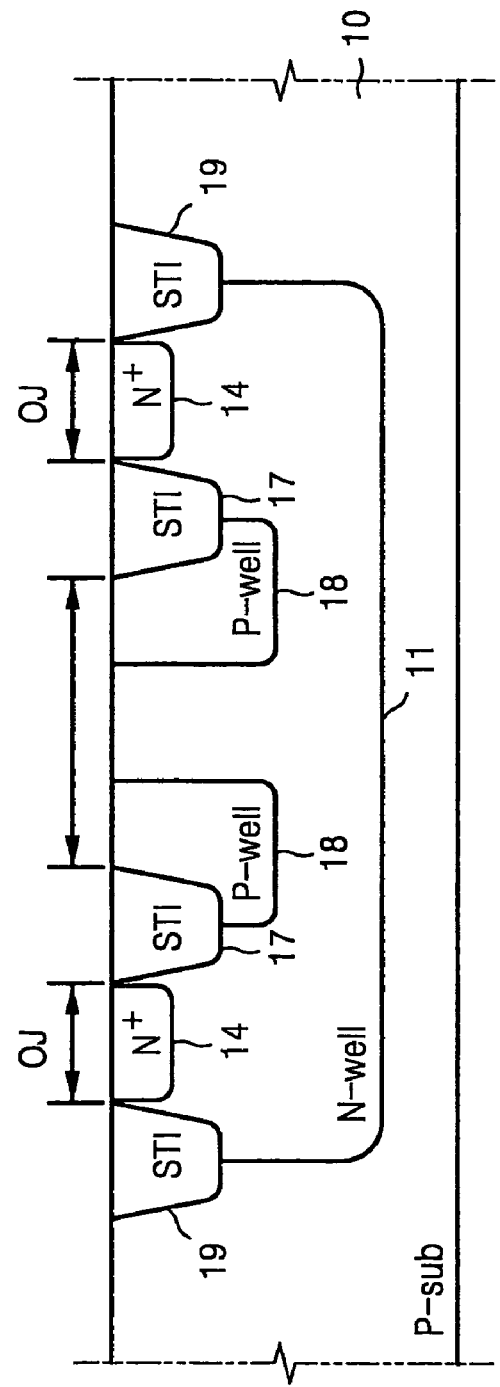

FIGS. 10 and 11 are cross-sectional views of the intermediate structures formed during a method for fabricating a schottky diode according to an example embodiment.

Referring to FIG. 10, a P-type semiconductor substrate 10 may include an N-type well 11, first and second device isolation regions 17 and 19 separating a schottky junction region SJ and an ohmic junction region OJ, and a P-type well guard 18 located in the N-type well 11. The N-type well 11 may be formed in the P-type semiconductor substrate 10. The N-type well 11 may be simultaneously formed during the formation of an N-type well of a PMOS transistor or CMOS transistor, which may be formed on the same semiconductor substrate 10 where the schottky diode is formed. For example, if the MOS transistor formed on the semiconductor substrate 10 is, for example, an HV PMOS transistor or an MV PMOS transistor, the N-type well may be an HV N-type well.

The first and second device isolation regions 17 and 19 may be formed in the semiconductor substrate to separate the schottky junction region SJ and the ohmic junction region OJ. The first and second device isolation regions 17 and 19 may be, for example, an STI. The first and second device isolation regions 17 and 19 may be simultaneously formed during the formation of the device isolation region of an NMOS transistor, PMOS transistor, or CMOS transistor which may be formed on the same semiconductor substrate 10 where the schottky diode may be formed.

The P-type well guard 18 may be formed having at least a portion thereof formed under the ohmic junction region OJ. The well guard 18 may be formed in the shape of a ring, for example, a square shaped ring, a rectangular shaped ring, a circular shaped ring, an elliptical shaped ring, or etc. The well guard 18 may be a variety of well types according to the breakdown voltage characteristic needed for the schottky diode 100. For example, the well guard 18 may be formed as a pocket P-type well used as a source/drain of an HV PMOS transistor or a P-type field IMP well type used as a well of an MV NMOS transistor or LV NMOS transistor.

The well guard 18 may be simultaneously formed during the formation of a P-type well of an NMOS transistor or CMOS transistor device, which may be formed on the same semiconductor substrate 10 where the schottky diode is formed. Although the well guard 18 may be formed after the first and second device isolation regions 17 and 19 are formed, the order of formation of the first and second device isolation regions 17 and 19 and the well guard 18 may be changed according to the type of the semiconductor device that is formed with the schottky diode.

Referring to FIG. 11, the N-type higher concentration junction region 14 may be formed in the ohmic junction region OJ. The N-type higher concentration junction region 14 may be simultaneously formed during the formation of the source/drain region of an NMOS transistor or CMOS transistor, which may be formed on the same semiconductor substrate 10 where the schottky diode is formed.

Referring to FIG. 2, the first and second electrodes 11 and 14 may be formed in the schottky junction region SJ and the ohmic junction region OJ of FIG. 11, respectively, to complete the schottky junction 13 and the ohmic junction 16. The first and second electrodes 11 and 14 may be formed by depositing metal, for example, titanium (Ti), tungsten (W), molybdenum (Mo), tantalum (Ta), cobalt (Co), nickel (Ni), or etc. in the schottky junction region SJ and the ohmic junction region OJ of FIG. 11 and applying a heat treatment to the deposited metal to form a silicide. For example, the silicide may be formed using cobalt to reduce the resistance of the first and second electrodes 11 and 14.

Because the first electrode 11 may be formed in the schottky junction region SJ of FIG. 11 at a desired (or, alternatively, a predetermined) interval from the first device isolation region 17, a defect in forming the silicide that may occur at an end portion of the schottky junction region SJ of FIG. 11 may be prevented. Thus, deterioration of the schottky diode characteristic may be prevented.

The first and second electrodes 11 and 14 may be simultaneously formed during the formation of a metal region constituting a contact area of an NMOS transistor, PMOS transistor, or CMOS transistor, which may be formed on the same semiconductor substrate 10 where the schottky diode is formed. Thereafter, the schottky diode may be completed using a typical conventional diode fabrication method.

Figure 12:
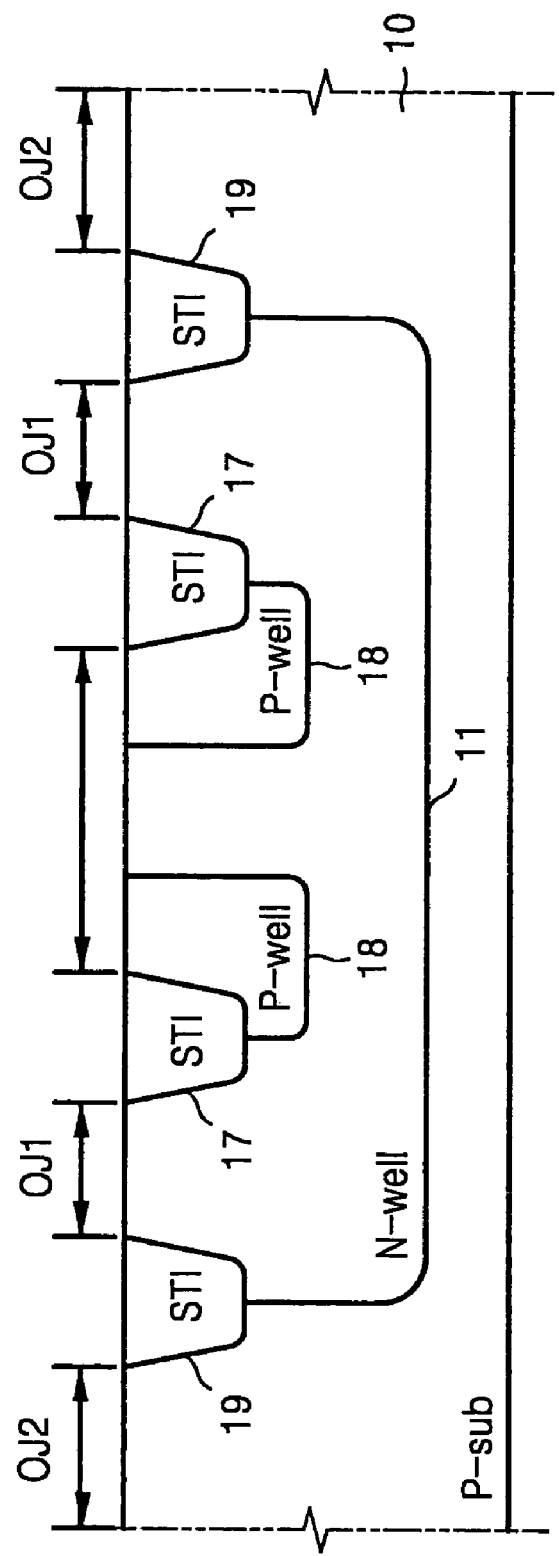
FIGS. 12 and 13 are cross-sectional views of the intermediate structures formed during a method for fabricating a schottky diode according to another example embodiment.
Figure 13:
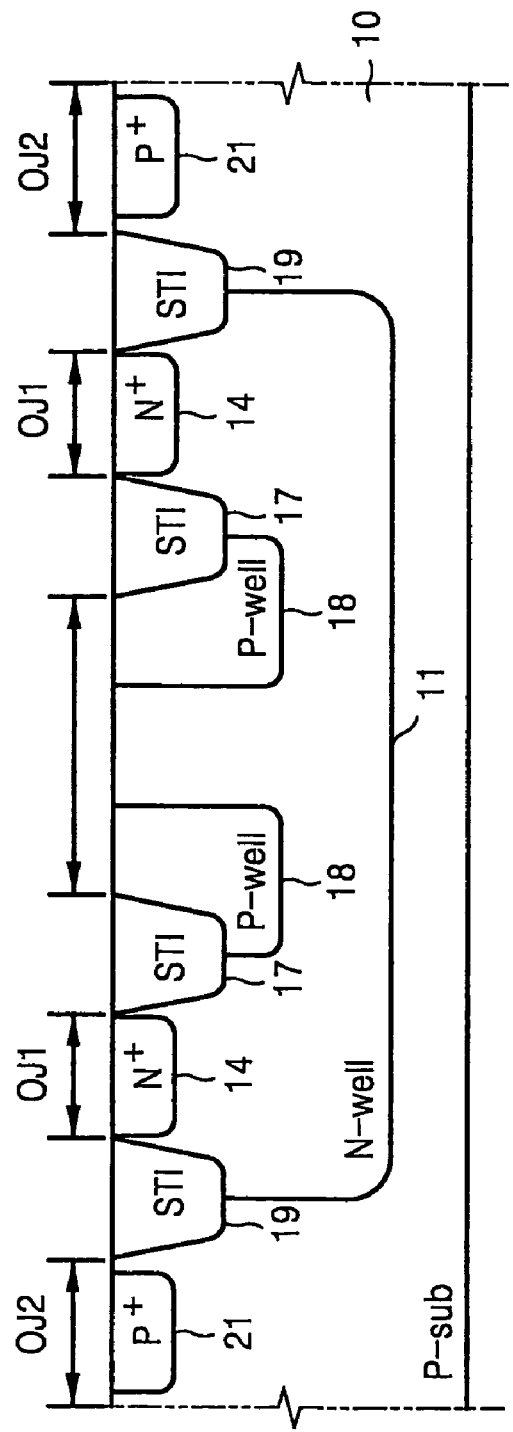

FIGS. 12 and 13 are cross-sectional views of the intermediate structures formed during a method for fabricating a schottky diode according to another example embodiment.

The method for fabricating a schottky diode according to another example embodiment may be substantially the same as the method for fabricating a schottky diode according to the example embodiment as shown in FIGS. 10 and 11, except that an ohmic junction 23 that may induce a leakage current to flow in the semiconductor substrate 10 may be formed in the semiconductor substrate 10. Thus, the method for fabricating a schottky diode according to another example embodiment will be described mainly regarding the difference from the method for fabricating a schottky diode according to the example embodiment as shown in FIGS. 10 and 11.

Referring to FIG. 12, a P-type semiconductor substrate 10 may include an N-type well 11, first and second device isolation regions 17 and 19 separating schottky junction region SJ and first and second ohmic junction regions OJ1 and OJ2, and a P-type well guard 18 located in the N-type well 11.

Referring to FIG. 13, an N-type higher concentration junction region 14 may be formed in the ohmic junction region OJ1. A P-type higher concentration junction region 21 that may induce a leakage current may be formed in the ohmic junction region OJ2. The N-type higher concentration junction region 14 and the P-type higher concentration junction region 21 may be simultaneously formed during the formation of the source/drain region of an NMOS transistor, PMOS transistor, or CMOS transistor, which may be formed on the same semiconductor substrate 10 where the schottky diode is formed.

Referring to FIG. 5, the first, second, and third electrodes 11, 14, and 21 may be formed in the schottky junction region SJ and the first and second ohmic junction regions OJ1 and OJ2 of the FIG. 12, respectively, to complete the schottky junction 13 and the first and second ohmic junctions 16 and 23. The first, second, and third electrodes 11, 14, and 21 may be formed by depositing metal, for example, titanium (Ti), tungsten (W), molybdenum (Mo), tantalum (Ta), cobalt (Co), nickel (Ni), or etc. in the schottky junction region SJ and the first and second ohmic junction regions OJ1 and OJ2 of FIG. 12 and applying a heat treatment to the deposited metal to form a silicide. For example, the silicide may be formed using cobalt to reduce the resistance of the first, second, and third electrodes 11, 14, and 21.

Because the first electrode 11 may be formed in the schottky junction region SJ of FIG. 12 at a desired (or, alternatively, a predetermined) interval from the first device isolation region 17, a defect in forming the silicide that may occur at an end portion of the schottky junction region SJ may be prevented. Thus, deterioration of the schottky diode characteristic may be prevented.

The first, second, and third electrodes 11, 14, and 21 may be simultaneously formed during the formation of a metal region constituting a contact area of an NMOS transistor, PMOS transistor, or CMOS transistor, which may be formed on the same semiconductor substrate 10 where the schottky diode is formed. Thereafter, the schottky diode may be completed using a conventional schottky diode fabrication method.

Figure 14:
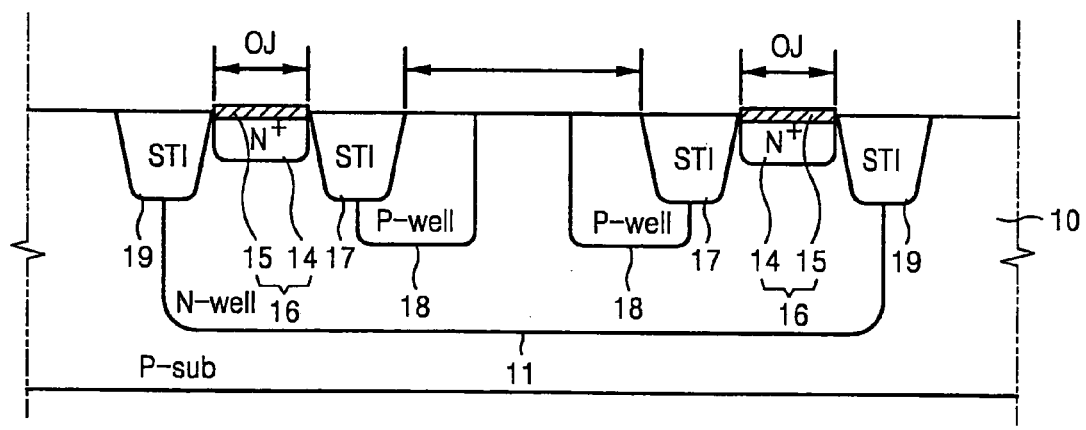
FIGS. 14 and 15 are cross-sectional views of the intermediate structures formed during a method for fabricating a schottky diode according to yet another example embodiment.
Figure 15:
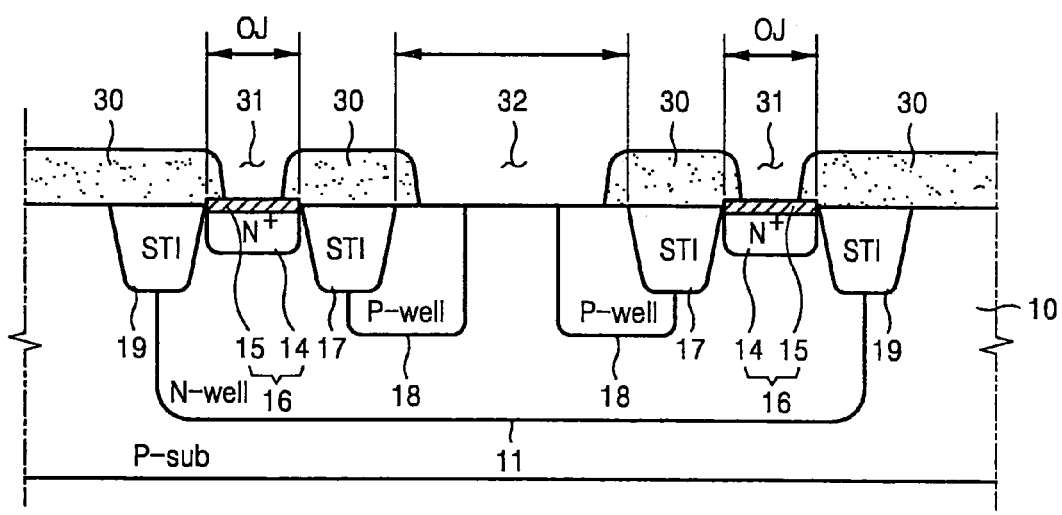

FIGS. 14 and 15 are cross-sectional views of the intermediate structures formed during a method for fabricating a schottky diode according to yet another example embodiment.

The method for fabricating a schottky diode according to yet another example embodiment may be substantially the same as the method for fabricating a schottky diode according to the example embodiment as shown in FIGS. 12 and 13, except that the first electrode of the schottky junction and the second electrode of the ohmic junction may be fabricated to include silicides different from each other. Thus, the method for fabricating a schottky diode will be described mainly regarding the difference from the method for fabricating a schottky diode according to the example embodiment as shown in FIGS. 10 and 11.

Referring to FIG. 10, the semiconductor substrate 10 may include an N-type well 11, first and second device isolation regions 17 and 19 separating the schottky junction region SJ and the ohmic junction region OJ, and a P-type well guard 18 located in the N-type well 11.

Referring to FIG. 14, the second electrode 15 may be formed in the N-type higher concentration junction region 14 of the ohmic junction region OJ, thus completing the ohmic junction 16. The second electrode 15 may be formed by depositing metal, for example, titanium (Ti), tungsten (W), molybdenum (Mo), tantalum (Ta), cobalt (Co), nickel (Ni), or etc. in the ohmic junction region OJ and applying a heat treatment to the deposited metal to form a silicide. For example, the silicide may be formed using cobalt to reduce the resistance of the electrode 15.

The second electrode 15 may be simultaneously formed during the formation of a metal region constituting a contact area of an NMOS transistor, PMOS transistor, or CMOS transistor, which may be formed on the same semiconductor substrate 10 where the schottky diode is formed.

Referring to FIG.15, an interlayer insulation film 30 may be formed on the semiconductor substrate 10. A first contact hole 31 that may expose at least a portion of the ohmic junction 16 and a second contact hole 32 that may expose at least a portion of the schottky junction region SJ may be formed on the interlayer insulation film 30. The second contact hole 32 may also expose at least a part of the well guard 18.

Referring to FIG. 7, a barrier metal film 41 may be formed that may cover the entire surface of the interlayer insulation film 30 and the exposed portions of the ohmic junction 16, schottky junction region SJ, and well guard 18. The barrier metal film 41 may prevent inter-diffusion of heterogeneous materials between a metal wiring (not shown) and the semiconductor substrate 10 and may be formed of, for example, titanium (Ti), tungsten (W), molybdenum (Mo), tantalum (Ta), cobalt (Co), nickel (Ni), or etc.

The barrier metal film 41 may be simultaneously formed during the formation of the barrier metal film of an NMOS transistor, PMOS transistor, or CMOS transistor, which may be formed on the same semiconductor substrate 10 where the schottky diode is formed.

The first electrode 42 may be formed in the schottky junction region SJ exposed through the second contact hole 32 so that the schottky junction 13' may be complete. Because the second contact hole 32 may expose only a portion of the schottky junction region SJ of FIG. 14, the first electrode 42 of the schottky junction 13 may be separated from the first device isolation region 17.

In an example embodiment, before forming the metal barrier layer 41, the first electrode 42 may be formed by depositing a metal, for example, titanium (Ti), tungsten (W), molybdenum (Mo), tantalum (Ta), cobalt (Co), nickel (Ni), or etc., in the schottky junction region SJ exposed through the second contact hole 32 and applying a heat treatment to the deposited metal to form a silicide.

The schottky diode may be completed using a conventional schottky diode fabrication method.

Figure 16:
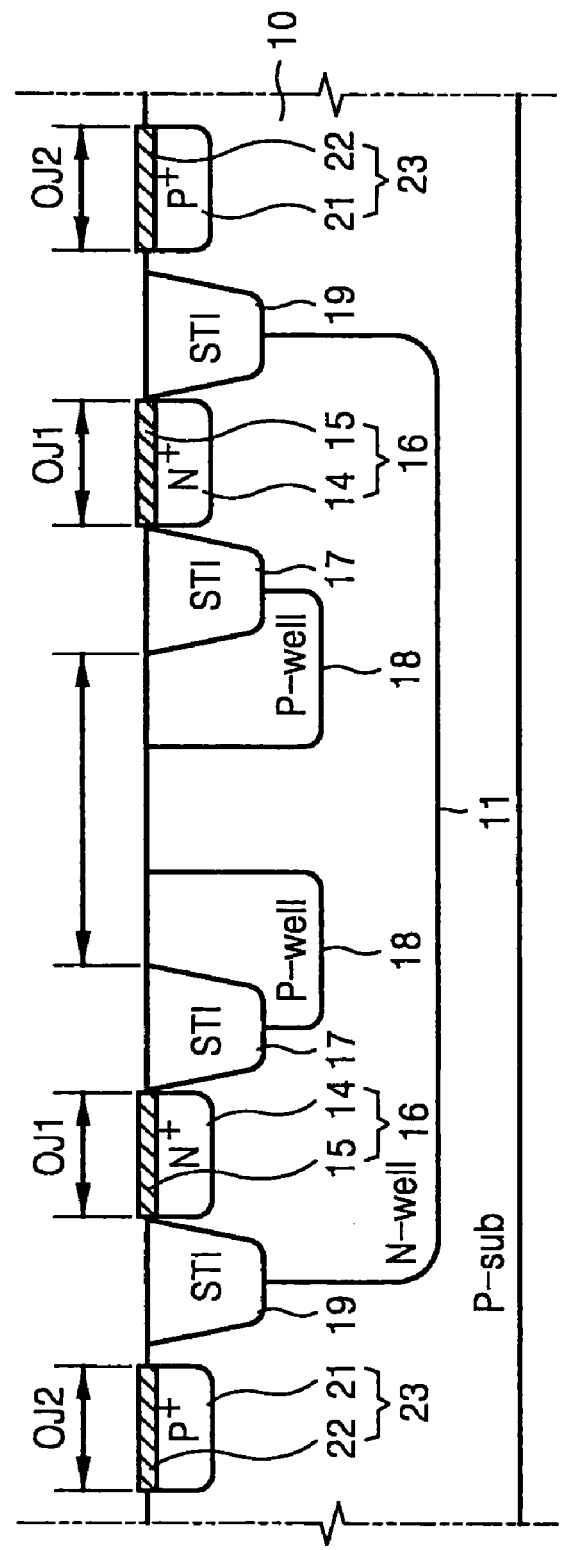
FIGS. 16 and 17 are cross-sectional views of the intermediate structures formed during a method for fabricating a schottky diode according to yet further another example embodiment.
Figure 17:
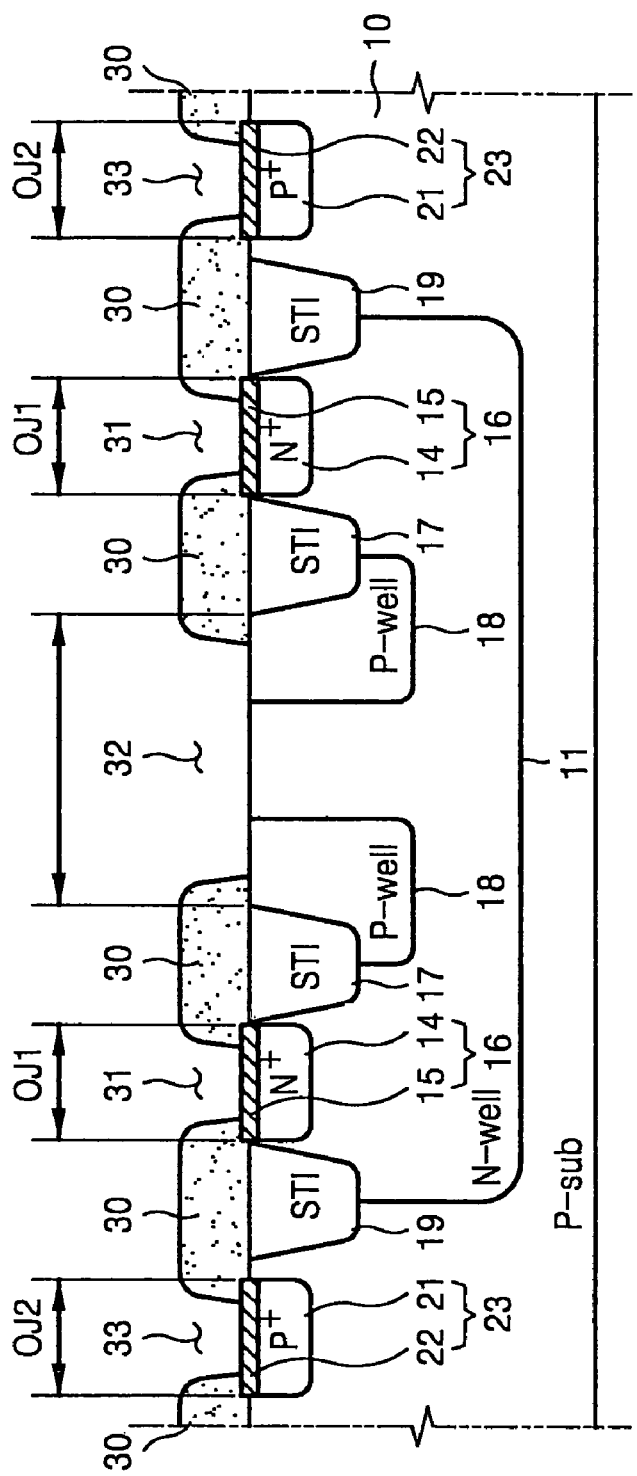

FIGS. 16 and 17 are cross-sectional views of the intermediate structures formed during a method for fabricating a schottky diode according to yet further another example embodiment.

The method for fabricating a schottky diode may be substantially the same as the method for fabricating a schottky diode according to the example embodiment as shown in FIGS. 12 and 13, except that the first electrode of the schottky junction and the second electrode of the first and second ohmic junctions may be fabricated to include silicides different from each other. Thus, the method for fabricating a schottky diode will be described mainly regarding the difference from the method for fabricating a schottky diode according to the example embodiment as shown in FIGS. 12 and 13.

Referring to FIG. 12, the semiconductor substrate 10 may include an N-type well 11, first and second device isolation regions 17 and 19 separating schottky junction region SJ and the first and second ohmic junction regions OJ1 and OJ2, and a P-type well guard 18 located in the N-type well 11.

Referring to FIG. 13, an N-type higher concentration junction region 14 may be formed in the ohmic junction region OJ1. The P-type higher concentration junction region 21 may be formed in the ohmic junction region OJ2 to induce a leakage current. The N-type higher concentration junction region 14 and the P-type higher concentration junction region 21 may be simultaneously formed during the formation of the source/drain region of an NMOS transistor, PMOS transistor, or CMOS transistor, which may be formed on the same semiconductor substrate 10 where the schottky diode is formed.

Referring to FIG. 16, the second and third electrodes 15 and 22 may be formed in the ohmic junction regions OJ1 and OJ2 to complete the first and second ohmic junctions 16 and 23. The first and second electrodes 15 and 22 may be formed by depositing metal, for example, titanium (Ti), tungsten (W), molybdenum (Mo), tantalum (Ta), cobalt (Co), nickel (Ni), or etc., in the first and second ohmic junction regions OJ1 and OJ2, respectively, and applying a heat treatment to the deposited metal to form a silicide. For example, the silicide may be formed using cobalt to reduce the resistance of the electrodes 15 and 22.

The second and third electrodes 15 and 22 may be simultaneously formed during the formation of a metal region constituting a contact area of an NMOS transistor, PMOS transistor, or CMOS transistor, which may be formed on the same semiconductor substrate 10 where the schottky diode is formed.

Referring to FIG. 17, an interlayer insulation film 30 may be formed on the semiconductor substrate 10 where the second and third electrodes 15 and 22 of the first and second ohmic junctions 16 and 23 are formed. First and second contact holes 31 and 33 may be formed in the interlayer insulation film 30 that may expose at least a portion of the first and second ohmic junctions 16 and 23. A second contact hole 32 may be formed in the interlayer insulation film 30 that may expose at least a portion of the schottky junction region SJ. The second contact hole 32 may also expose at least a portion of the well guard 18.

Referring to FIG. 9, a barrier metal film 41 may be formed that may cover the entire surface of the interlayer insulation film 30 and the exposed portions of the first and second ohmic junctions 16 and 23, the schottky junction region SJ, and the well guard 18. The barrier metal film 41 may be formed of, for example, titanium (Ti), tungsten (W), molybdenum (Mo), tantalum (Ta), cobalt (Co), nickel (Ni), or etc.

The barrier metal film 41 may be simultaneously formed during the formation of the barrier metal film of an NMOS transistor, PMOS transistor, or CMOS transistor which may be formed on the same semiconductor substrate 10 where the schottky diode is formed.

The first electrode 42 may be formed in the schottky junction region SJ through the second contact hole 32 so that the schottky junction 13' may be complete. Because the second contact hole 32 may expose only a portion of the schottky junction region SJ of FIG. 16, the first electrode 42 of the schottky junction 13' may be separated from the first device isolation region 17.

In an example embodiment, before forming the metal barrier layer 41, the first electrode 42 may be formed by depositing a metal, for example, titanium (Ti), tungsten (W), molybdenum (Mo), tantalum (Ta), cobalt (Co), nickel (Ni), or etc., in the schottky junction region SJ exposed through the second contact hole 32 and applying a heat treatment to the deposited metal to form a silicide.

The schottky diode may be completed using a conventional schottky diode fabrication method.

Figure 18:
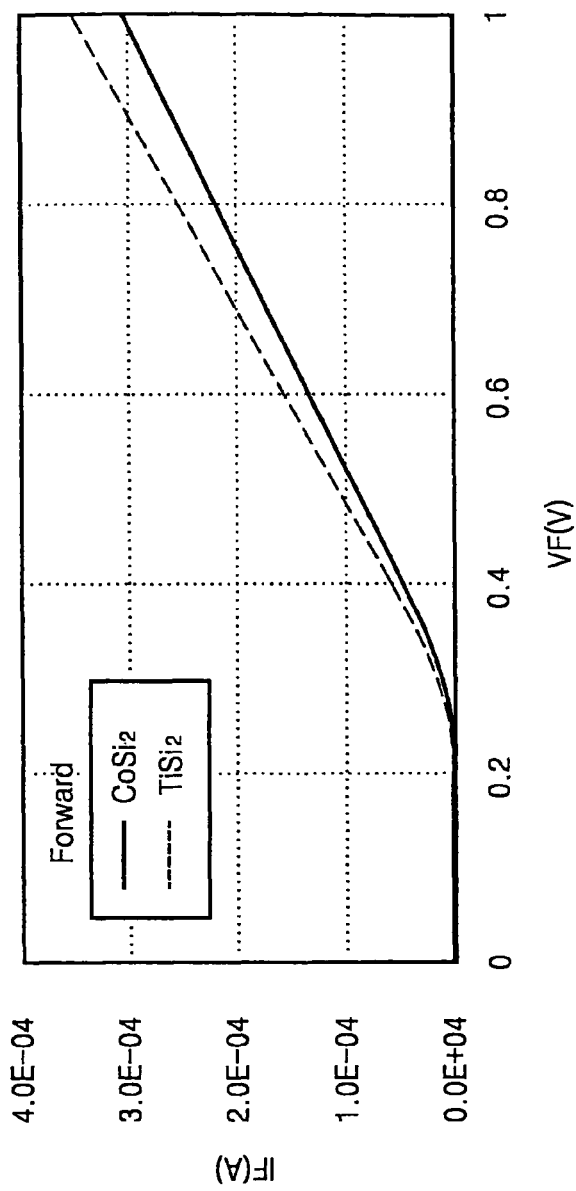
FIGS. 18 and 19 are graphs showing the electrical characteristic of the schottky diode according to example embodiments.
Figure 19:
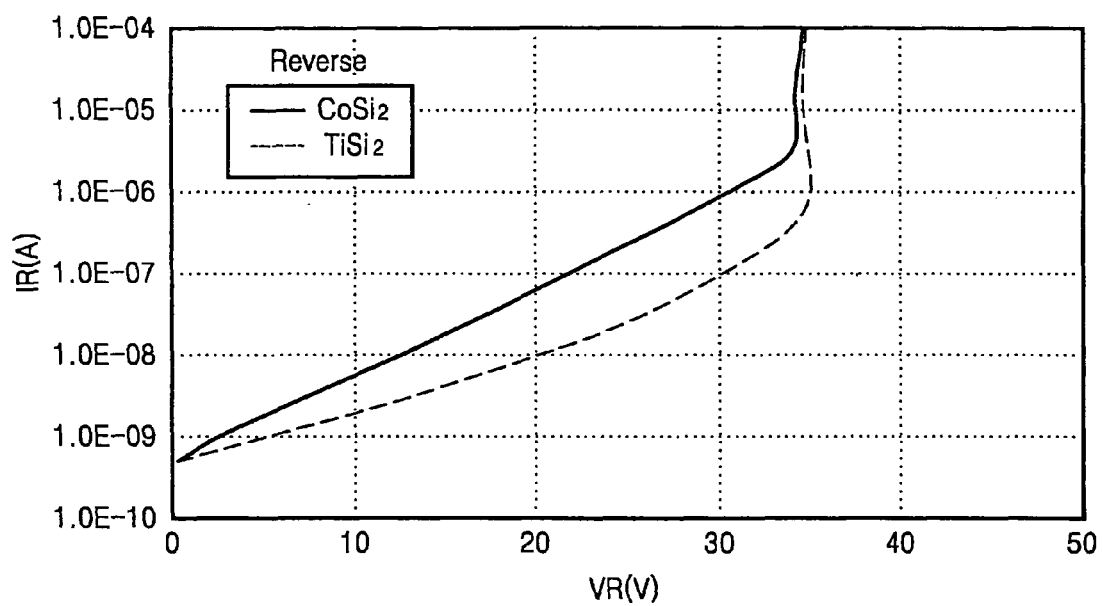

FIGS. 18 and 19 are graphs comparing the electrical characteristics of schottky diodes fabricated according to example embodiments. Referring to FIGS. 18 and 19, comparison of the electrical characteristic of the schottky diode fabricated according to example embodiments, for example, between the electrodes of the schottky junction formed of cobalt silicide ($CoSi_2$) and titanium silicide ($TiSi_2$), shows the turn-on voltage may be about 0.3 V (FIG. 17) and the reverse breakdown voltage may be about 34 V, which may satisfy the basic schottky diode characteristic.

Example embodiments may provide a schottky diode that may be fabricated without deterioration of the schottky diode characteristic.

Example embodiments may provide a schottky diode that may be formed on the same semiconductor substrate with a PMOS transistor, NMOS transistor, or CMOS transistor, thus an additional process to fabricate the schottky diode may not be required.

Example embodiments may provide a method for fabricating a schottky diode that may improve the efficiency of production of semiconductor devices.

While this invention has been particularly shown and described with reference to example embodiments thereof, it will be understood by those skilled in the art that various changes in form and details may be made therein without departing from the spirit and scope as defined by the appended claims.

What is claimed is:

1. A schottky diode comprising:
a schottky junction including a well formed in a semiconductor substrate and a first electrode including titanium silicide contacting the well, the well having a first conductivity type;
a first ohmic junction including a first junction region formed in the well and a second electrode including cobalt silicide contacting the first junction region, the first junction region having a higher concentration of the first conductivity type than the well;
a first device isolation region formed in the semiconductor substrate separating the schottky junction and the first ohmic junction; and
a well guard having a second conductivity type opposite to the first conductivity type formed in the well, at least a portion of the well guard formed under a portion of the schottky junction.

* * * * *

UNITED STATES PATENT AND TRADEMARK OFFICE
CERTIFICATE OF CORRECTION

PATENT NO. : 8,018,021 B2
APPLICATION NO. : 12/662452
DATED : September 13, 2011
INVENTOR(S) : Dae-Shik Kim et al.

Page 1 of 1

It is certified that error appears in the above-identified patent and that said Letters Patent is hereby corrected as shown below:

Title Page, please add

(30) Foreign Application Priority Data

July 5, 2006 (KR) .............................. 10-2006-0062838

Signed and Sealed this
Thirteenth Day of March, 2012

David J. Kappos
*Director of the United States Patent and Trademark Office*